United States Patent
Ok et al.

(10) Patent No.: US 9,627,322 B2
(45) Date of Patent: Apr. 18, 2017

(54) SEMICONDUCTOR DEVICE HAVING REDUCED CONTACT RESISTANCE

(71) Applicant: International Business Machines Corporation, Armonk, NY (US)

(72) Inventors: Injo Ok, Loudonville, NY (US); Balasubramanian S. Pranatharthiharan, Watervliet, NY (US); Charan V. Surisetty, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/828,639

(22) Filed: Aug. 18, 2015

(65) Prior Publication Data
US 2016/0148872 A1    May 26, 2016

Related U.S. Application Data

(62) Division of application No. 14/549,679, filed on Nov. 21, 2014, now Pat. No. 9,275,901.

(51) Int. Cl.
| | |
|---|---|
| *H01L 23/535* | (2006.01) |
| *H01L 21/768* | (2006.01) |
| *H01L 21/3105* | (2006.01) |
| *H01L 23/485* | (2006.01) |
| *H01L 23/532* | (2006.01) |
| *H01L 27/02* | (2006.01) |
| *H01L 27/088* | (2006.01) |

(52) U.S. Cl.
CPC ...... *H01L 23/535* (2013.01); *H01L 21/31056* (2013.01); *H01L 21/76843* (2013.01); *H01L 21/76865* (2013.01); *H01L 21/76877* (2013.01); *H01L 21/76897* (2013.01); *H01L 23/485* (2013.01); *H01L 23/53266* (2013.01); *H01L 27/0207* (2013.01); *H01L 27/088* (2013.01); *H01L 2924/0002* (2013.01)

(58) Field of Classification Search
CPC ............ H01L 23/535; H01L 21/76897; H01L 21/31056; H01L 23/485; H01L 23/53266; H01L 27/0207; H01L 27/088; H01L 21/76843; H01L 21/76865; H01L 21/76877

See application file for complete search history.

(56) References Cited

U.S. PATENT DOCUMENTS

2015/0097250 A1\* 4/2015 Cheon ................. H01L 27/0886
257/401

OTHER PUBLICATIONS

List of IBM Patents or Patent Applications Treated as Related; (Appendix P), Filed Aug. 21, 2015; 2 pages.
Ok et al., "Semiconductor Device Having Reduced Contact Resistance", U.S. Appl. No. 14/549,679, filed Nov. 21, 2014.

\* cited by examiner

*Primary Examiner* — Long Pham
(74) *Attorney, Agent, or Firm* — Cantor Colburn LLP; Steven Meyers

(57) ABSTRACT

A semiconductor device including at least one self-aligned contact has at least one gate electrode on a bulk substrate layer of the semiconductor device. A gate cap encapsulates the at least one gate electrode. The semiconductor device further includes at least one contact separated from the at least one gate electrode via a portion of the gate cap. The at least one contact includes a metal portion that directly contacts the gate cap.

9 Claims, 9 Drawing Sheets

SEMICONDUCTOR DEVICE HAVING REDUCED CONTACT RESISTANCE

DOMESTIC PRIORITY

This application is a divisional of U.S. patent application Ser. No. 14/549,679, filed Nov. 21, 2014, the disclosure of which is incorporated by reference herein in its entirety.

BACKGROUND

The present invention relates to semiconductor devices, and more specifically, to semiconductor devices including self-aligned contacts (SACs) having a reduced contact resistance.

Semiconductor devices typically include polysilicon gates interposed between a pair of metal contacts. The evolution of semiconductor technology has resulted in decreased gate length scaling and reduced device pitch. As device pitch has decreased, a need to decrease the spacing between metal contacts and the gate electrode has become increasingly important. However, producing small spaces between the gate electrode and the adjacent metal contacts can result in short circuits and other undesirable effects.

One solution to this problem has been to form a gate electrode with self-aligned contacts. The self-aligned contact fabrication process typically includes fully encapsulating the gate electrode with an insulative material (i.e., a gate cap), subsequently forming, in the insulating material, one or more trenches including a barrier layer disposed on the trench sidewalls, and filling the trenches with a metal material to form a metal contact. Accordingly, short-circuit connections between the gate electrode and the metal contacts can be avoided. The barrier layer, however, is susceptible to the formation of one or more irregular features such as raised shoulder portions, for example, when the barrier layer encounters corners formed during the trench formation process. The irregular barrier features can pinch the metal material when filling the contact trenches, in turn causing the formation of one or more voids (e.g., air gaps) in the metal contacts. These voids increase the resistance of the metal contacts, thereby reducing the overall current throughput.

SUMMARY

According to at least one embodiment of the present invention, a method of fabricating a semiconductor device including at least one self-aligned contact comprises forming at least one trench that extends through a gate cap encapsulating at least one gate electrode formed on a bulk substrate layer of the semiconductor device. The method further comprises depositing a barrier layer that conforms to sidewalls of the at least one trench and contacts the at least one gate cap. The method further comprises selectively etching a portion of the barrier layer contacting the at least one gate cap. The method further comprises filling the at least one trench with a metal material without pinching the metal material to form the at least one self-aligned contact.

According to another embodiment, a semiconductor device including at least one self-aligned contact comprises at least one gate electrode formed on a bulk substrate layer of the semiconductor device. A gate cap encapsulates the at least one gate electrode. The semiconductor device further includes at least one contact that is separated from the at least one gate electrode via a portion of the gate cap. The semiconductor device further includes a barrier layer interposed between the at least one contact and a portion of the gate cap such that a metal portion of the contact is formed directly against the gate cap.

According to yet another embodiment, a semiconductor device including at least one self-aligned contact comprises at least one gate electrode on a bulk substrate layer of the semiconductor device. A gate cap encapsulates the at least one gate electrode. The semiconductor device further includes at least one contact separated from the at least one gate electrode via a portion of the gate cap. The at least one contact includes a metal portion that directly contacts the gate cap.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings. FIGS. 1-9 are series of drawings illustrating a process of fabricating a semiconductor device including self-aligned contacts in which:

FIG. 1 is a cross-sectional view of an intermediate semiconductor device including a first contact trench coated with a barrier layer interposed between gate caps encapsulating a pair of gate electrodes formed on a first portion of a bulk substrate, and a second contact trench coated with a barrier layer interposed between gate caps encapsulating a pair of gate electrodes formed on a second portion of the bulk substrate;

FIG. 2 illustrates the intermediate semiconductor device of FIG. 1 following deposition of an organic planarization layer (OPL) on the barrier layers to fill the first and second contact trenches;

FIG. 3 illustrates the intermediate semiconductor device of FIG. 2 after partially recessing the OPL in the first and second contact trenches;

FIG. 4 illustrates the intermediate semiconductor device of FIG. 3 after partially etching the barrier layer and stopping on an upper portion of the remaining OPL to remove barrier features from the trench sidewalls;

FIG. 5 illustrates the intermediate semiconductor device of FIG. 4 after removing the remaining OPL from within the first and second contact trenches;

FIG. 6 illustrates a final semiconductor device after filling the contact trenches with a metal material to form metal contacts including a portion of the barrier layer interposed between the gate caps and the metal contacts;

FIG. 7 illustrates an intermediate semiconductor device after removing a remaining portion of the OPL from within the contact trenches according to another embodiment of the invention;

FIG. 8 illustrates the intermediate semiconductor device of FIG. 7 after removing the remaining portion of the barrier layer from within the contact trenches; and FIG. 9 illustrates a final semiconductor device after depositing a metal material in the contact trenches to form metal contacts formed directly against the gate caps that encapsulate the gate electrodes.

DETAILED DESCRIPTION

Various embodiments of the invention provide a semiconductor device including self-aligned metal contacts (SACs) that exclude barrier layer irregularities from the sidewall of the contact trench. For instance, portions of the barrier layer which include undesirable barrier features that intrude into the contact trench and cause pinching of the metal material during the metal fill process are removed prior to filling the contact trenches. Thus, the formation of undesirable voids (e.g., air gaps) in the metal contacts is greatly reduced or eliminated altogether. The reduction of voids in the metal contact reduces the resistance of the metal contact. Therefore, at least one embodiment of the invention provides a semiconductor device including SACs having low contact resistance and improved current throughput.

Figure 1:
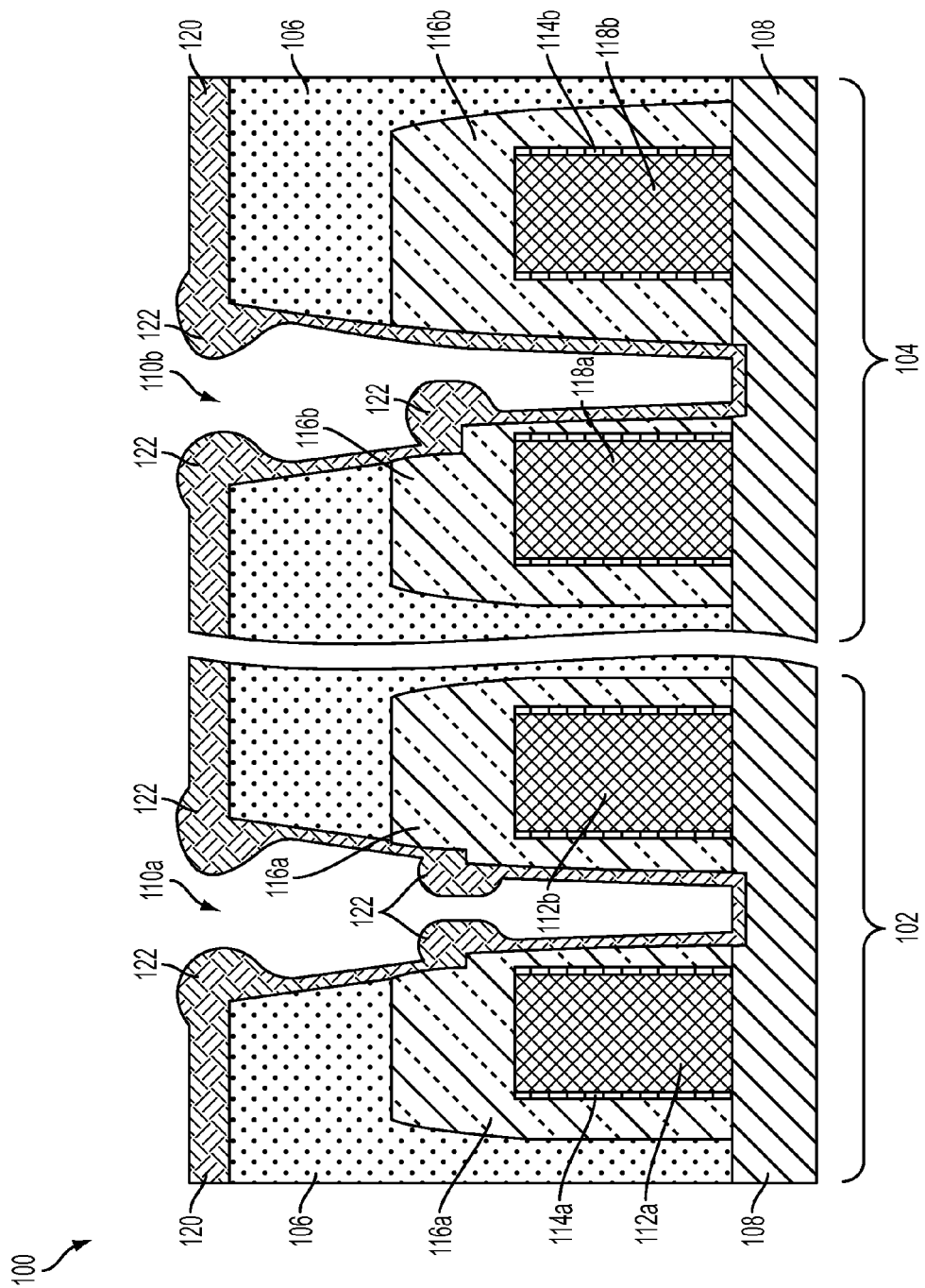

With reference now to FIG. 1, an intermediate semiconductor device 100 is illustrated following the formation of contact trenches according to well-known SAC formation techniques. In the present specification and claims, an "intermediate" semiconductor device is defined as a semiconductor device in a stage of fabrication prior to a final stage. The intermediate semiconductor device 100 includes a first portion 102 and a second portion 104. Each of the first portion 102 and second portion 104 include a middle of line (MOL) oxide layer 106 formed on bulk substrate layer 108. The MOL oxide layer 106 comprises various oxide materials including, but not limited to, silicon oxide ($SiO_2$), amorphous siliconborocarbonitride (SiBCN), silicon oxycarbonitride (SiOCN). The bulk substrate layer 108 comprises, for example, silicon (Si).

The first portion 102 includes a first contact trench 110a interposed between a first gate electrode 112a and a second gate electrode 112b. The first metal electrode 112a and second metal electrode 112b are each formed on the bulk substrate layer 108 of the semiconductor device 100, and comprise various materials such as, for example, tungsten (W). A gate dielectric film 114a is formed on the sidewalls of the first and second gate electrodes 112a-112b. The gate dielectric film 114a can comprise various high-k dielectric materials including, but not limited to, hafnium oxide ($HfO_2$), zirconium dioxide ($ZrO_2$), lanthanum oxide ($La_2O_3$). Although the gate dielectric film 114a is shown as being formed only on the gate electrode sidewalls, it is appreciated that the gate dielectric film 114a may also be formed on an upper portion of the first and second gate electrodes 112a-112b.

As further illustrated in FIG. 1, the first gate electrode 112a and the second gate electrode 112b are each encapsulated by a gate cap 116a. The gate cap 116a comprises an insulating material such as silicon nitride ($Si_3N_4$), for example, which isolates the first and second gate electrodes 112a-112b from the first contact trench 110a. The gate cap 116a includes sidewall portions formed on the gate dielectric film 114a, and an upper portion formed on an upper surface of the gate electrodes 112a-112b. In this manner, the upper portion of the gate cap 116a is interposed between the MOL oxide layer 106 and the first and second gate electrodes 112a-112b.

In a similar fashion, the second portion 104 includes a second contact trench 110b interposed between a third gate electrode 118a and a fourth gate electrode 118b. The third gate electrode 118a and the fourth gate electrode 118b are each formed on the bulk substrate layer 108 and comprise of tungsten (W), for example. A gate dielectric film 114b is formed on the sidewalls of the third and fourth gate electrodes 118a-118b. The gate dielectric film 114b can comprise various high-k dielectric materials including, but not limited to, hafnium oxide ($HfO_2$), zirconium dioxide ($ZrO_2$), lanthanum oxide ($La_2O_3$). Although the gate dielectric film 114b is shown as being formed only on the gate electrode sidewalls, it is appreciated that the gate dielectric film 114b may also be formed on an upper portion of the third and fourth gate electrodes 118a-118b.

As further illustrated in FIG. 1, the third gate electrode 118a and the fourth gate electrode 118b are each encapsulated by a gate cap 116b. The gate cap 116b comprises an insulating material such as silicon nitride ($Si_3N_4$), for example, which isolates the third and fourth gate electrodes 118a-118b from the second contact trench 110b. The gate cap 116b includes sidewall portions formed on the gate dielectric film 114b, and an upper portion formed on an upper surface of the gate electrodes 118a-118b. In this manner, the upper portion of the gate cap 116b is interposed between the MOL oxide layer 106 and the third and fourth gate electrodes 118a-118b.

The first and second portions 102-104 each include a barrier layer 120 that conforms to the upper surface of the MOL oxide layer 106, the inner walls of the first and second contact trenches 110a-110b, and a portion of the bulk substrate 108 exposed by the first trench 110a and second trench 110b. The barrier layer 120 comprises titanium nitride (TiN) and/or titanium (Ti), for example, and may act as a metal-fill diffusion barrier as understood by one of ordinary skill in the art. The barrier layer 120 can have a thickness ranging, for example, from approximately 3 nanometers (nm) to approximately 10 nm. As further illustrated in FIG. 1, one or more irregular barrier features 122 may develop when depositing the barrier layer 120. The barrier features 122 typically form when encountering underlying corners, and extend from the corners into the trench. Consequently, the barrier features 122 decrease the width of the trenches 110a-110b and can induce a pinching-effect when filling the contact trenches with a metal-material.

Figure 2:
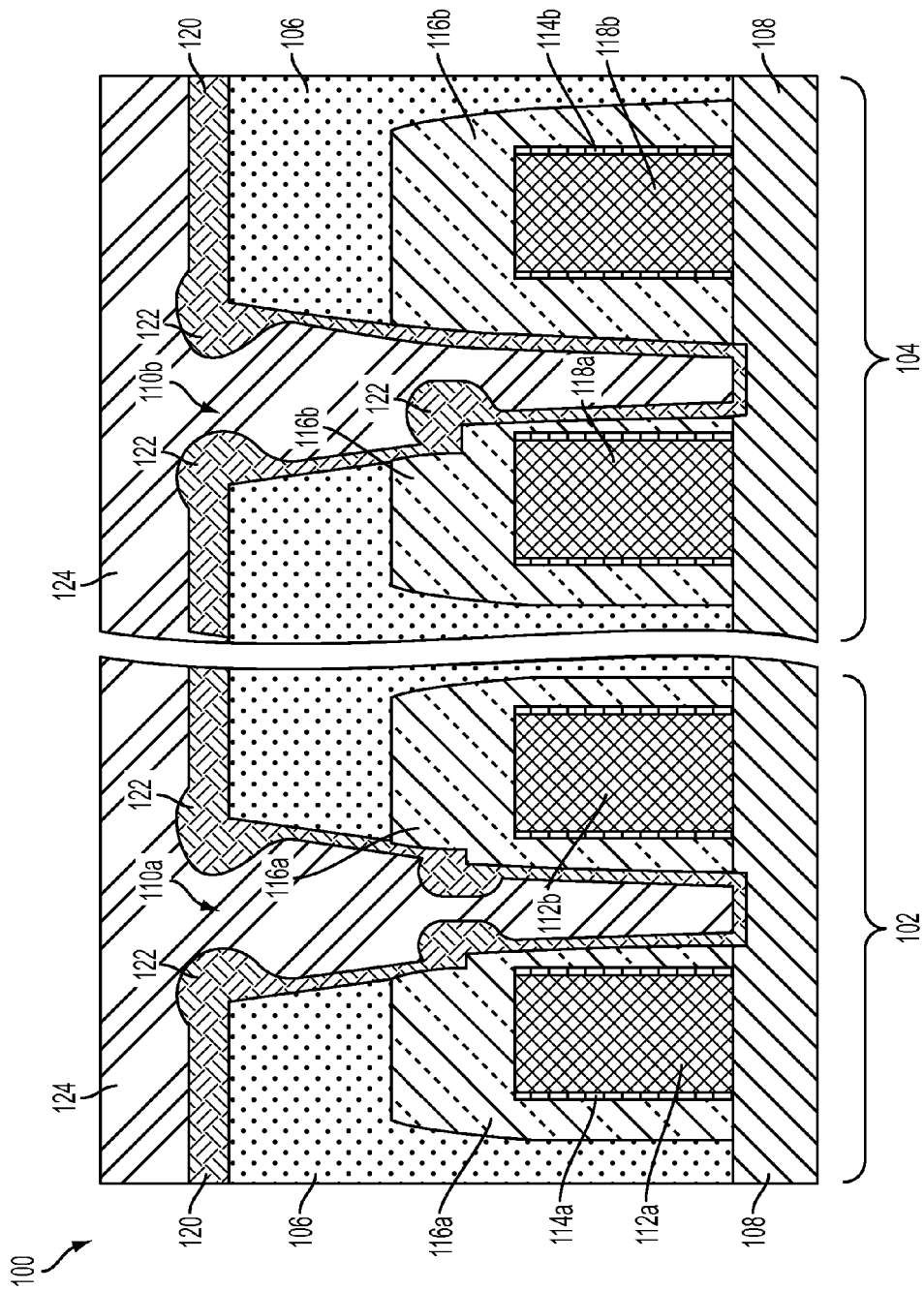

Turning now to FIG. 2, an organic planarizing layer (OPL) 124 is deposited on an upper surface of the barrier layer 120 and fills the first and second contact trenches 110a-110b. The OPL 124 is deposited on the barrier layer 120 using a well-known spin-coating process and can comprise various organic polymer materials including, but not limited to, polyacrylate resin, epoxy resin, phenol resin, polyamide resin, polyimide resin, unsaturated polyester resin, polyphenylenether resin, polyphenylenesulfide resin, and benzocyclobutene (BCB).

Figure 3:
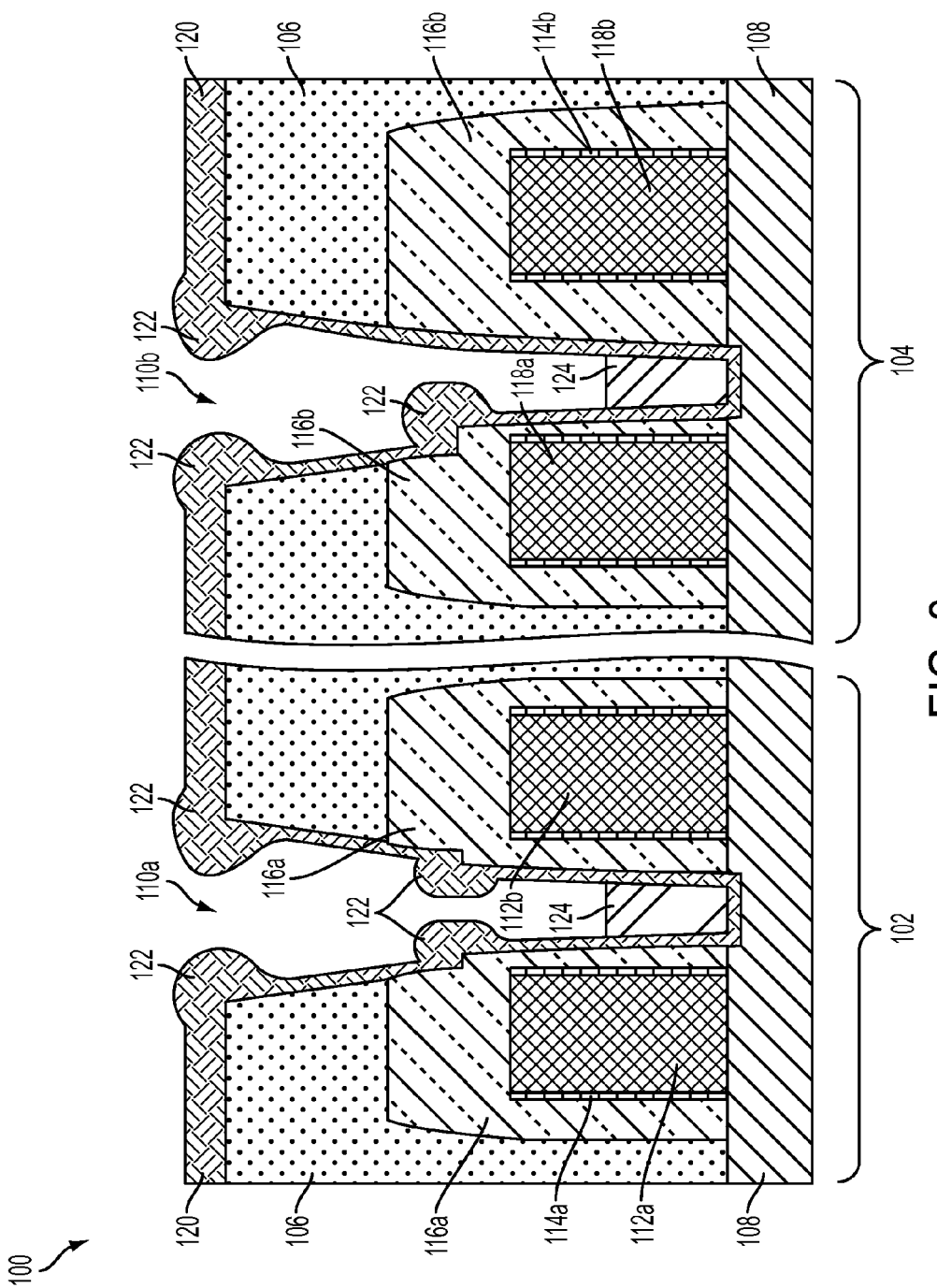

Referring to FIG. 3, the OPL 124 is partially recessed to re-expose the trenches 110a-110b. According to an embodiment, the OPL 124 is recessed such that a partial amount of OPL 124 remains deposited below the interface between MOL oxide layer 106 and the gate caps 116a-116b. Although the remaining OPL 124 is shown as being disposed below the adjacent gate electrodes 112a-112b and 118a-118b, the invention is not limited thereto. A plasma etch including oxygen can be used to oxidize (i.e., ash) the OPL 124 such that the OPL 124 is recessed selective to the material of the barrier layer 120 (e.g., TiN). In this manner, the OPL 124 can be partially recessed such that the irregular barrier features 122 are exposed.

Figure 4:
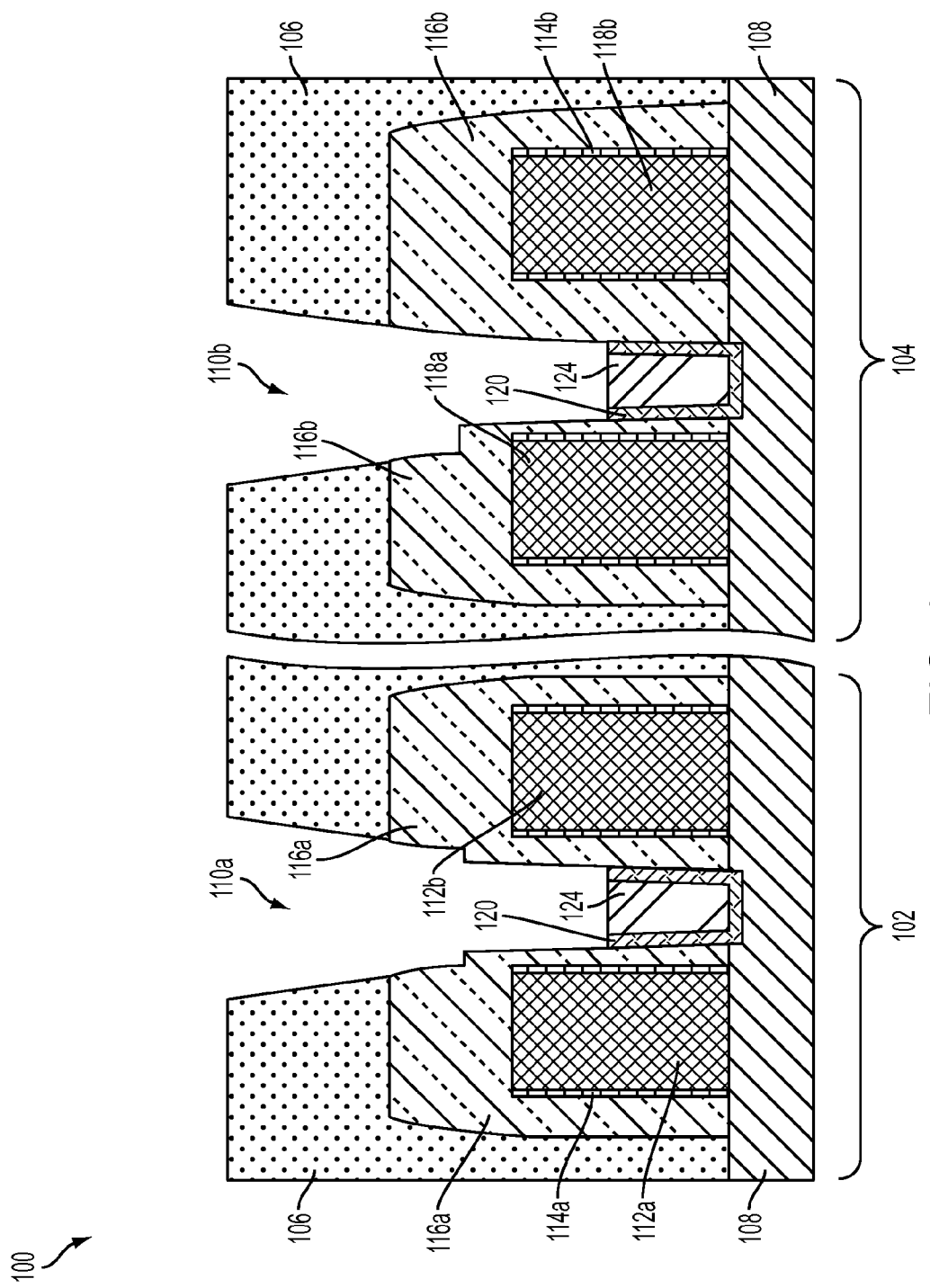

Turning to FIG. 4, the exposed portion of the barrier layer 120 is selectively etched with respect to the MOL oxide layer 106, the gate caps 116a-116b, and the remaining OPL 124. According to an embodiment, a reactive ion etching (RIE) process is used to selectively remove the exposed barrier layer 120 while stopping on the upper surface of the remaining OPL 124. In this manner, the irregular barrier features 122 are removed and an upper surface of the remaining barrier layer 120 is flush with the upper surface of the OPL 124.

Figure 5:
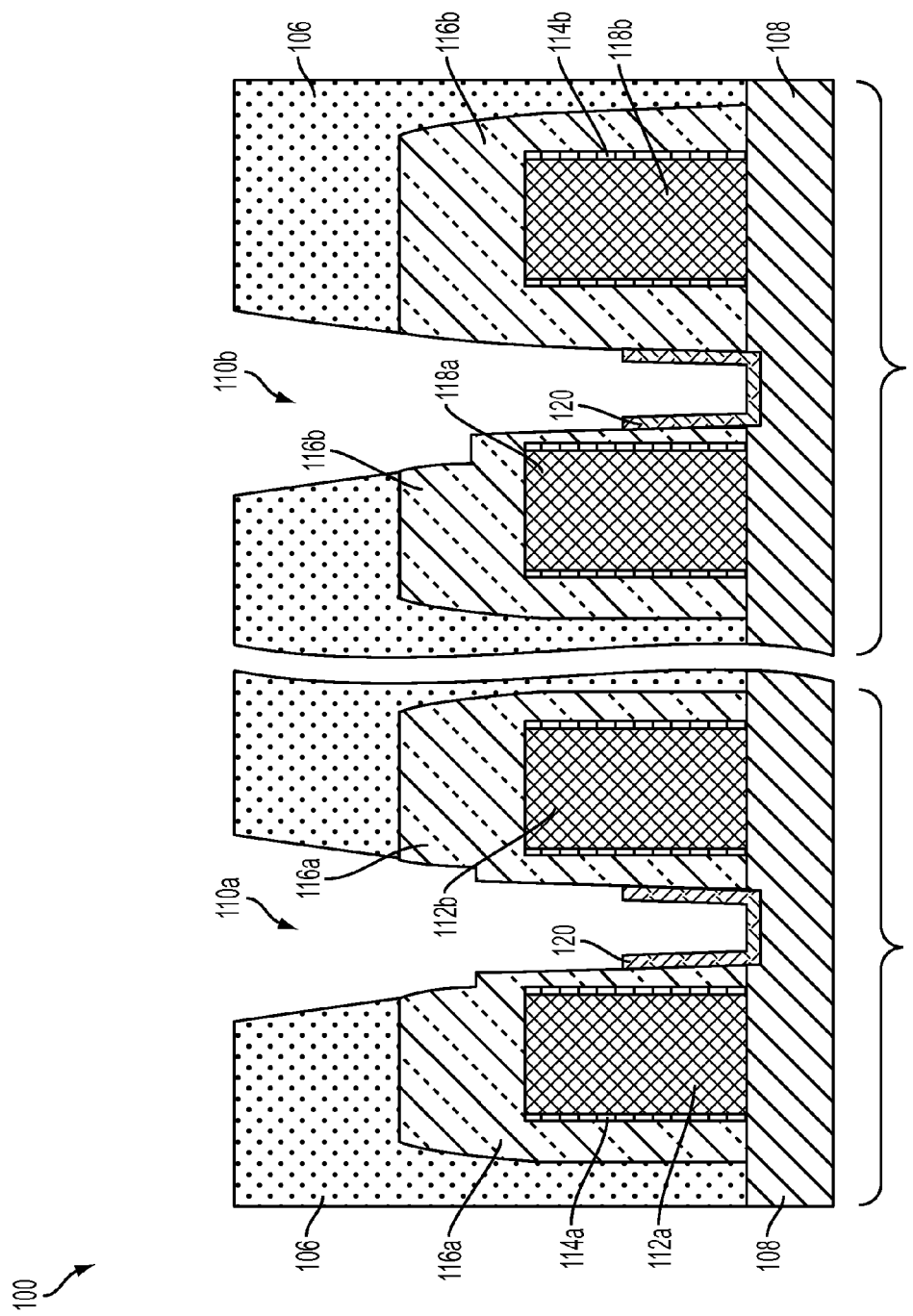

Referring to FIG. 5, a second plasma etching process including oxygen can be used to selectively oxidize (i.e., ash) the remaining OPL 124. In this manner, the OPL 124 is fully removed from the contact trenches 110a-110b. As further illustrated in FIG. 5, however, a partially recessed portion of the barrier layer 120 remains in the bottom portion of the contact trenches 110a-110b. The partially recessed portion of the barrier layer 120 includes a base portion formed on the bulk substrate layer 108 and an upper portion extending no further than the gate cap 116a-116b. According to an embodiment, the upper portion of the barrier layer 120 is disposed below the upper portion of the gate electrodes 112a-112b and 118a-118b.

Figure 6:
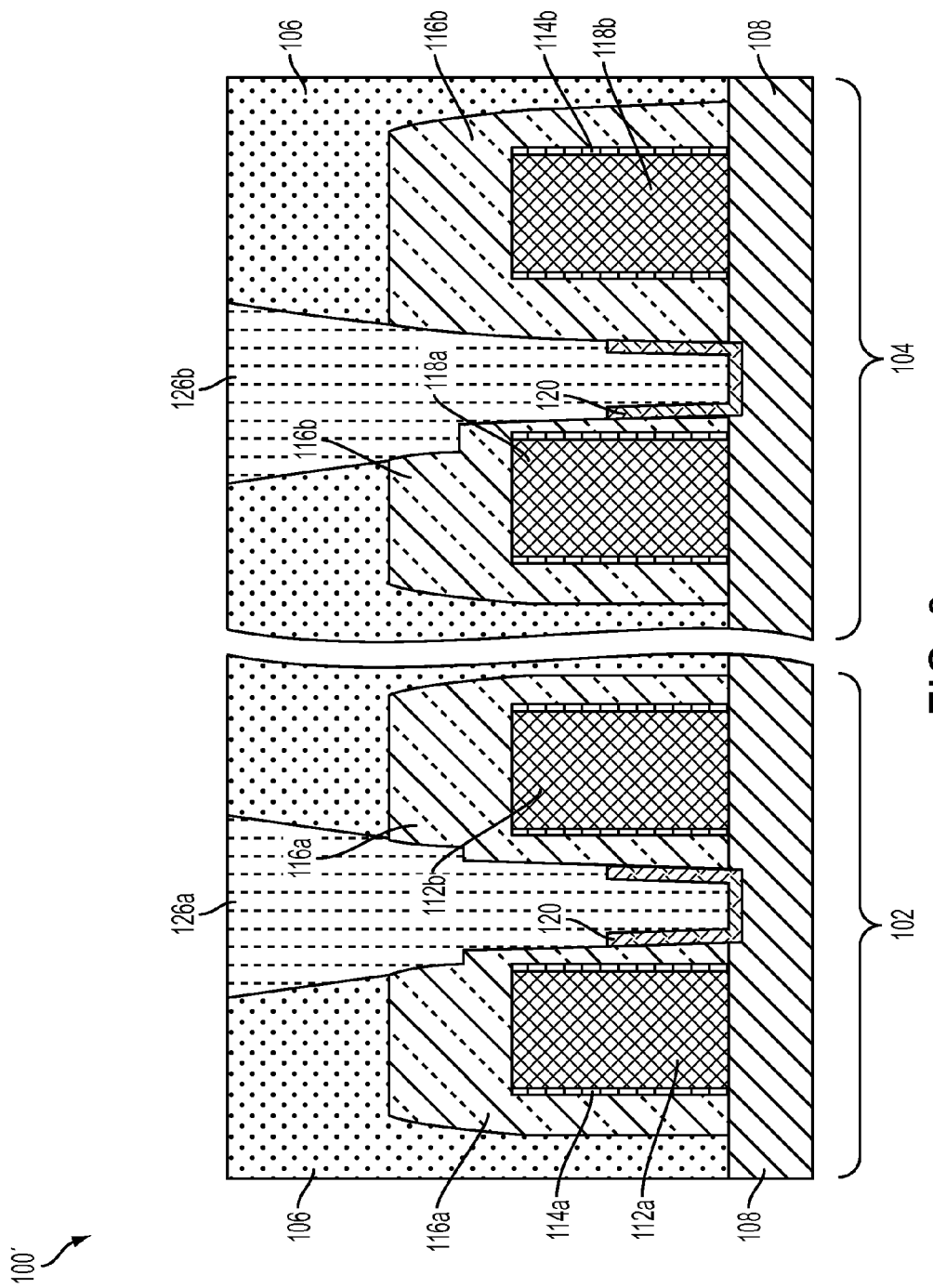

Referring now to FIG. 6, a final semiconductor device 100' including self-aligned contacts is illustrated according to a non-limiting embodiment. More specifically, the first and second contact trenches 110a-110b are filled with a metal material such as, for example, tungsten (W) to form first and second self-aligned contacts 126a-126b. In this manner, the remaining portion of the barrier layer 120 is interposed between only a portion of the gate cap 116a-116b and a portion of the metal contacts 126a-126b. As further illustrated in FIG. 6, a metal portion of the contacts 126a-126b is formed directly against a portion of the gate caps 116a-116b. A chemical vapor deposition (CVD) process is used, for example, to fill the first and second contact trenches 110a-110b. A chemical-mechanical planarization (CMP) process may also be performed such that the upper surface of the metal material 126a-1226b is flush with the upper surface of the MOL oxide layer 106.

According to an embodiment, the tungsten metal comprises fluorine (F), i.e., a fluorine-based tungsten material. In this embodiment, the remaining portion of the barrier layer 120 prevents the underlying substrate 108 from fluorine attack during the CVD-tungsten fill. As further illustrated in FIG. 6, the first and second contacts 126a-126b are free of any voids (e.g., air gaps) due to the pinching-effect that occurs during conventional metal fill processes since the irregular barrier features 122 are removed prior to forming the contacts 126a-126b. In this manner, at least one embodiment of the invention provides a semiconductor device including one or more self-aligned contacts 126a-126b having a low contact resistance, and thus improved current throughput when compared to conventional semiconductor devices formed with self-aligned contacts.

Figure 7:
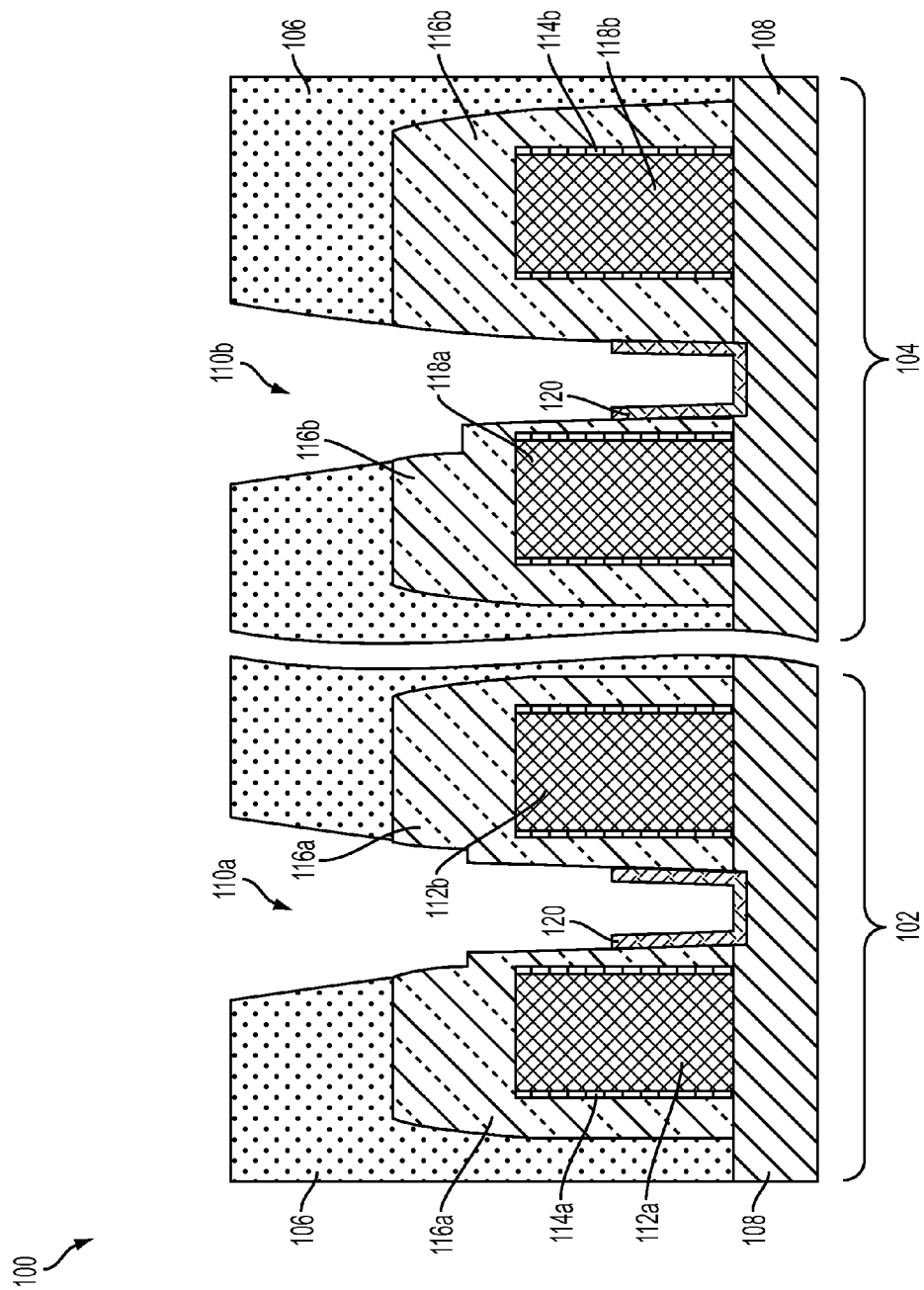

According to another embodiment, the tungsten metal is a fluorine-free tungsten (FFW) material. In this embodiment, therefore, the CVD-tungsten fill poses no risk of fluorine attack on the substrate 108. Accordingly, the barrier layer 120 can be completely removed before filling the first and second contact trenches 110a-110b with the FFW material. Referring to FIG. 7, for example, the intermediate semiconductor device 100 is illustrated following removal of the remaining OPL 124 from the first and second contact trenches 110a-110b. In this embodiment, however, a FFW material will be used to fill the contact trenches 110a-110b.

Figure 8:
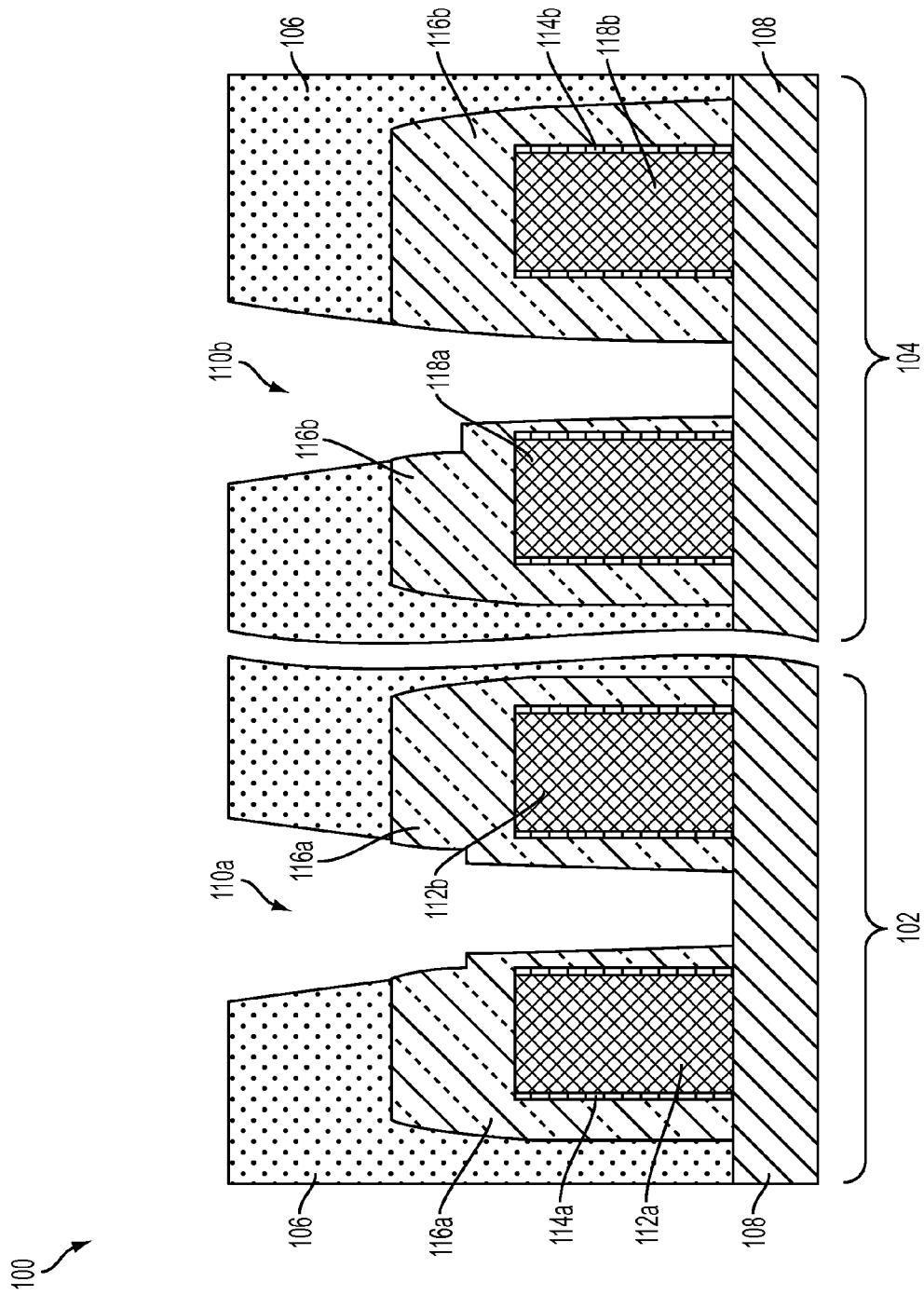

Turning to FIG. 8, the remaining portion of the barrier layer 120 is selectively etched with respect to the MOL oxide layer 106, the gate caps 116a-116b, and substrate 108. As described above, a selective reactive ion etching (RIE) process can be used to selectively remove the remaining portion of the barrier layer 120 while stopping on the upper surface substrate 108.

Figure 9:
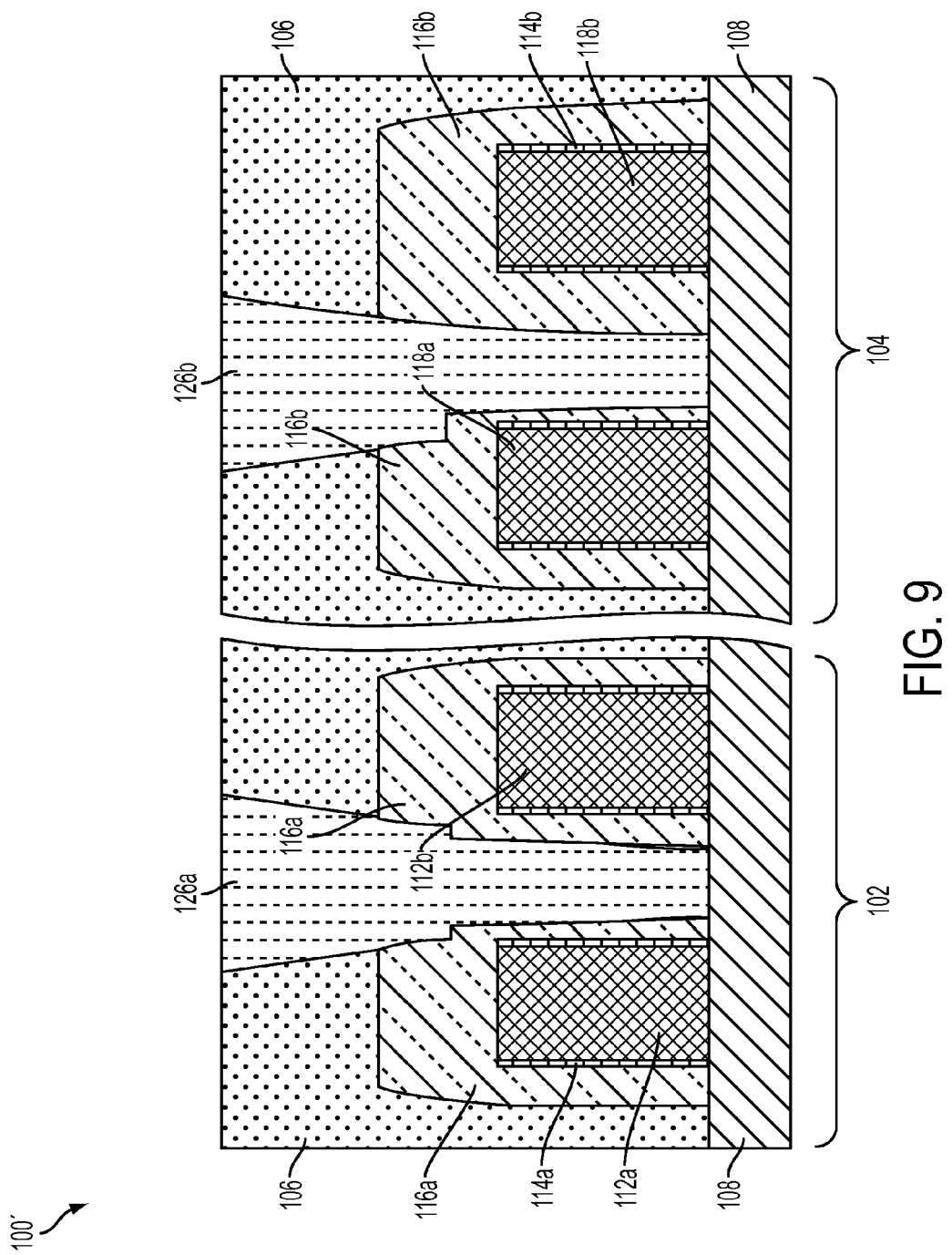

Referring now to FIG. 9, a final semiconductor device 100' including self-aligned contacts is illustrated. More specifically, a FFW material is deposited in the first and second contact trenches 110a-110b. A CMP process is also performed such that the upper surface FFW material is flush with the upper surface of the MOL oxide layer 106 to form first and second self-aligned contacts 126a-126b. As further illustrated in FIG. 9, the entire metal portion of the contacts 126a-126b is formed directly against the gate caps 116a-116b. Since the portion of the barrier layer 120 containing the barrier features 122 was etched away prior to filling the first and second contact trenches 110a-110b with the FFW material, the FFW material is not pinched. Accordingly, the contacts 126a-126b exclude the voids (e.g., air gaps) which typically occur in conventional semiconductor devices formed with self-aligned contacts. Therefore, various embodiments of the invention provide a semiconductor device 100' including one or more self-aligned contacts 126a-126b having a low contact resistance, and thus improved current throughput.

It is therefore apparent in light of the various embodiment described above that at least one embodiment of the invention improves over conventional semiconductor devices by providing a semiconductor device including self-aligned metal contacts (SACs) that exclude barrier layer irregularities from the sidewall of the contact trench. For instance, portions of the barrier layer which include undesirable barrier irregularities that intrude into the contact trench and cause pinching of the metal material during the metal fill process are removed prior to filling the contact trenches. Thus, the formation of undesirable voids (e.g., air gaps) in the metal contacts is greatly reduced or eliminated altogether. By reducing the number of voids that result from pinching the metal material during the metal fill process, the overall resistance of the metal contact is reduced. Therefore, at least one embodiment of the invention provides a semiconductor device including SACs having low contact resistance and improved current throughput when compared to conventional SAC semiconductor devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A semiconductor device including at least one self-aligned contact, comprising:
    at least one gate electrode on a bulk substrate layer of the semiconductor device;
    a gate cap that encapsulates the at least one gate electrode;
    at least one contact separated from the at least one gate electrode via a portion of the gate cap; and
    a barrier layer interposed between the at least one contact and a portion of the gate cap such that a metal portion of the contact is formed directly against the gate cap.

2. The semiconductor device of claim 1, wherein the at least one contact comprises fluorine-based tungsten.

3. The semiconductor device of claim 2, wherein the barrier layer includes a base portion on the bulk substrate layer and an upper portion extending no further than gate cap.

4. The semiconductor device of claim 3, wherein the gate cap is formed from silicon nitride.

5. The semiconductor device of claim 4, wherein the at least one gate electrode includes a first gate electrode and a second electrode, the at least one contact interposed between the first and second gate electrode.

6. A semiconductor device including at least one self-aligned contact, comprising:
    at least one gate electrode on a bulk substrate layer of the semiconductor device;
    a gate cap that encapsulates the at least one gate electrode; and
    at least one contact separated from the at least one gate electrode via a portion of the gate cap, the at least one contact formed directly against the gate cap and the bulk substrate layer and including a metal portion that directly contacts the gate cap.

7. The semiconductor device of claim 6, wherein the at least one contact comprises fluorine-free tungsten.

8. The semiconductor device of claim 7, wherein the at least one contact excludes a barrier layer.

9. The semiconductor device of claim 6, wherein the at least one gate electrode includes a first gate electrode and a second electrode, the at least one contact interposed between the first and second gate electrode.

* * * * *